(12) United States Patent
Yen et al.

(10) Patent No.: US 8,895,328 B2
(45) Date of Patent: Nov. 25, 2014

(54) FABRICATION METHOD OF LIGHT-EMITTING DEVICE

(75) Inventors: Sheng Horng Yen, Hsinchu (TW); Yung Hsiang Lin, Hsinchu (TW); Ying Yong Su, Hsinchu (TW); Han Min Wu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 244 days.

(21) Appl. No.: 13/451,709

(22) Filed: Apr. 20, 2012

(65) Prior Publication Data

US 2013/0280832 A1    Oct. 24, 2013

(51) Int. Cl.
*H01L 21/00* (2006.01)
*H01L 33/00* (2010.01)

(52) U.S. Cl.
CPC .......... *H01L 33/0079* (2013.01); *H01L 33/005* (2013.01); *Y10S 438/977* (2013.01)
USPC ...................... 438/22; 438/977; 257/E33.002

(58) Field of Classification Search
CPC ........................... H01L 33/005; H01L 33/0079
USPC .............................. 257/E33.002; 438/22, 977
See application file for complete search history.

(56) References Cited

U.S. PATENT DOCUMENTS

| | | | |
|---|---|---|---|
| 7,105,857 B2 | 9/2006 | Nagahama et al. | |
| 7,378,334 B2 | 5/2008 | Nagahama et al. | |
| 7,682,855 B2 * | 3/2010 | Yang et al. | 438/29 |
| 2003/0183832 A1 * | 10/2003 | Ishida et al. | 257/94 |
| 2009/0206354 A1 * | 8/2009 | Kitano et al. | 257/98 |

FOREIGN PATENT DOCUMENTS

TW      415117      12/2000

\* cited by examiner

*Primary Examiner* — Robert Huber
(74) *Attorney, Agent, or Firm* — Ditthavong & Steiner, P.C.

(57) ABSTRACT

A fabrication method of a light-emitting device comprises providing a growth substrate; forming a protective layer on a first surface of the growth substrate; and forming a first semiconductor layer on a second surface of the growth substrate opposite to the first surface, wherein the coefficient of thermal expansion of the growth substrate is smaller than that of the protective layer and the first semiconductor layer.

16 Claims, 5 Drawing Sheets

FABRICATION METHOD OF LIGHT-EMITTING DEVICE

TECHNICAL FIELD

The application relates to a fabrication method of a light-emitting device.

DESCRIPTION OF BACKGROUND ART

The light-emitting diode (LED) is a solid state semiconductor device, which has been broadly used as a light-emitting device. The light-emitting device structure comprises a semiconductor stack comprising a p-type semiconductor layer, an n-type semiconductor layer, and a light-emitting layer formed between the p-type semiconductor layer and the n-type semiconductor layer. The structure of the light-emitting device generally comprises III-V group compound semiconductor such as gallium phosphide (GaP), gallium arsenide (GaAs), or gallium nitride (GaN). The light-emitting principle of the LED is the transformation of electrical energy to optical energy by applying electrical current to the p-n junction to generate electrons and holes. Then, the LED emits light when the electrons and the holes combine.

For the light-emitting device, sapphire is often used as the growth substrate, but it is difficult to reduce the cost because the cost of the sapphire substrate is high.

FIG. 1 illustrates a cross-sectional diagram of a light-emitting device using a silicon substrate 10 as a growth substrate. A semiconductor layer 11 such as gallium nitride (GaN) is formed on the silicon substrate 10. The coefficient of thermal expansion (CTE) of the silicon substrate 10 is $3.59 \times 10^{-6} \, K^{-1}$ and the CTE of the semiconductor layer 11 such as gallium nitride (GaN) is $5.59 \times 10^{-6} \, K^{-1}$. The difference of the coefficient of thermal expansion (CTE) between the silicon substrate 10 and the semiconductor layer 11 is over 50%. The difference of CTE between the semiconductor layer 11 and the silicon substrate 10 provides a tensile stress as illustrated in FIG. 1. FIG. 2 illustrates a plane view of a surface of the light-emitting device. As shown in FIG. 2, the chipping and cracking of the light-emitting device easily occur accompanied with the tensile stress.

SUMMARY OF THE APPLICATION

A fabrication method of a light-emitting device comprises providing a growth substrate; forming a protective layer on a first surface of the growth substrate; and forming a first semiconductor layer on a second surface of the growth substrate opposite to the first surface, wherein the coefficient of thermal expansion of the growth substrate is smaller than that of the protective layer and the first semiconductor layer.

DETAILED DESCRIPTION OF PREFERRED EMBODIMENTS

Figure 1:
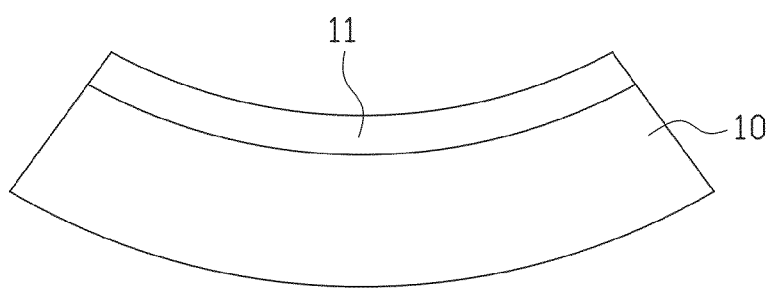
FIG. 1 illustrates a cross-sectional diagram of a conventional light-emitting device.

The embodiment of the application is illustrated in detail, and is plotted in the drawings. The same or the similar part is illustrated in the drawings and the specification with the same number.

Figure 3A:
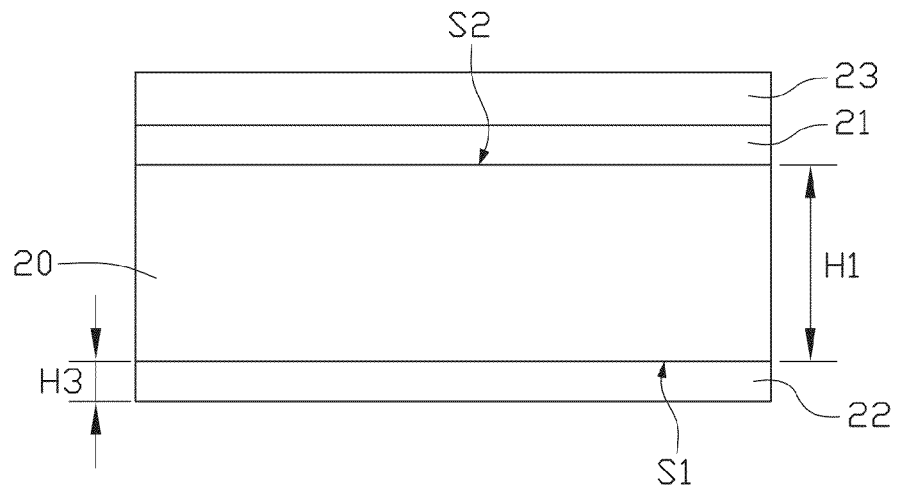
FIGS. 3A-3B illustrate cross-sectional diagrams of a fabrication method of a light-emitting device according to an embodiment of the present application.

As shown in FIG. 3A, the present application discloses a fabrication method of a light-emitting device, and the steps of the fabrication method comprise providing a growth substrate 20; forming a protective layer 22 on a first surface 51 of the growth substrate 20; and forming a first semiconductor layer 23 on a second surface S2 of the growth substrate 20, wherein the coefficient of thermal expansion of the growth substrate 20 is smaller than that of the protective layer 22 and the first semiconductor layer 23.

The material of the first semiconductor layer 23 comprises AlGaInP-based material or GaN-based material. The coefficient of thermal expansion (CTE) of AlGaInP-based material or GaN-based material is between $4 \times 10^{-6} \, K^{-1}$ to $6 \times 10^{-6} \, K^{-1}$. The first semiconductor layer 23 is epitaxially grown on the growth substrate 20. The method for forming the first semiconductor layer 23 is not particularly limited. Besides a metal organic chemical vapor deposition method (MOCVD method), the first semiconductor layer 23 may be formed by a known method such as a molecular beam epitaxy method (MBE method), a hydride vapor phase epitaxy method (HVPE method), a sputtering method, an ion-plating method, or an electron showering method. The fabrication method of the light-emitting device further comprises forming a second semiconductor layer (not shown) comprising an electrical conductivity type different from that of the first semiconductor layer 23 on the growth substrate 20, and forming a light-emitting layer (not shown) between the first semiconductor layer 23 and the second semiconductor layer (not shown) to form a semiconductor stack (not shown). The coefficient of thermal expansion (CTE) of the semiconductor stack is between $4 \times 10^{-6} \, K^{-1}$ to $6 \times 10^{-6} \, K^{-1}$. The thickness of the semiconductor stack is between 2 µm and 5 µm.

The growth substrate 20 comprises the first surface S1 and the second surface S2 formed opposite to the first surface S1. The thickness H1 of the growth substrate 20 is between 400 µm and 1500 µm, preferably between 1000 µm and 1500 µm. In an embodiment of the present application, the growth substrate 20 can be a silicon substrate. The coefficient of thermal expansion (CTE) of the silicon is $3.59 \times 10^{-6} \, K^{-1}$.

The protective layer 22 is formed on the first surface S1 of the growth substrate 20. The material of the protective layer 22 comprises dielectric material such as $SiO_2$, $Al_2O_3$, semiconductor material such as GaN, or metal material such as W, Mo, Cr, Ni. The method for forming the protective layer 22 comprises a sputtering method or an E-gun method. The coefficient of thermal expansion (CTE) of the protective layer 22 is between $6 \times 10^{-6} \, K^{-1}$ to $8 \times 10^{-6} \, K^{-1}$. The thickness H3 of the protective layer 22 is between 1 µm and 5 µm. In an embodiment of the present application, the CTE of the protective layer 22 is at least larger than the CTE of the first semiconductor layer 23, and the thickness of the protective layer 22 is small than or approximately the same as that of the semiconductor stack (not shown).

The steps of the fabrication method further comprises forming a buffer layer 21 between the growth substrate 20 and the first semiconductor layer 23. The material of the buffer layer 21 comprises semiconductor material such as SiN-based material or AlN-based material. The material of the buffer layer 21 dose not comprise gallium to avoid the reaction between silicon and gallium that causes void between the interface of the buffer layer 21 and the growth substrate 20. The buffer layer 21 prevents the AlGaInP-based material or GaN-based material semiconductor layer to directly contact the growth substrate 20. The buffer layer 21 can be epitaxially grown on the growth substrate 20. The method of forming the buffer layer 21 is not particularly limited. The thickness of the buffer layer 21 is below 200 nm.

Figure 2:
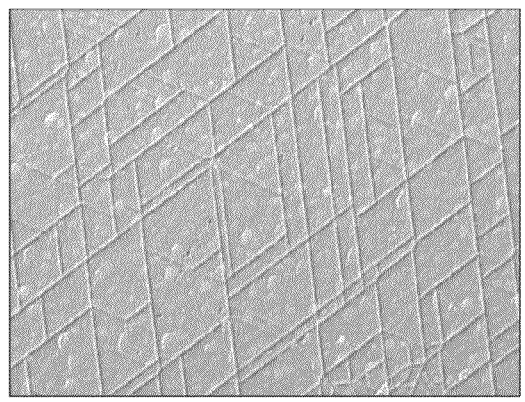
FIG. 2 illustrates a plane view of a surface of a conventional light-emitting device.
Figure 3B:
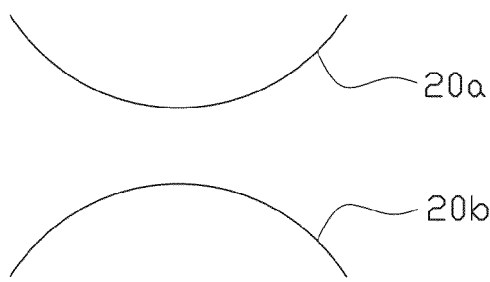
Figure 3C:
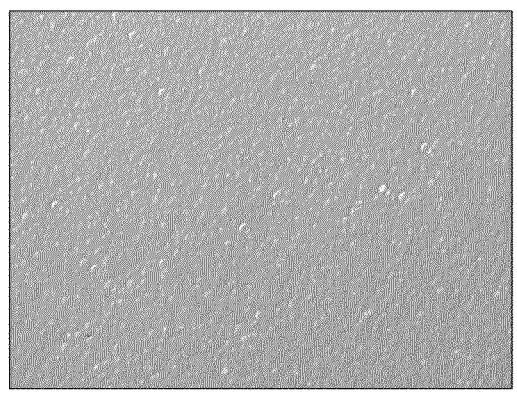
FIG. 3C illustrates a plane view of a surface of a light-emitting device according to an embodiment of the present application.
Figure 4A:
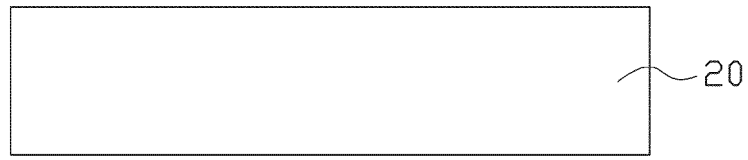
FIGS. 4A-4F illustrate cross-sectional diagrams of a process flow of a fabrication method of a light-emitting device according to an embodiment of the present application.
Figure 4B:
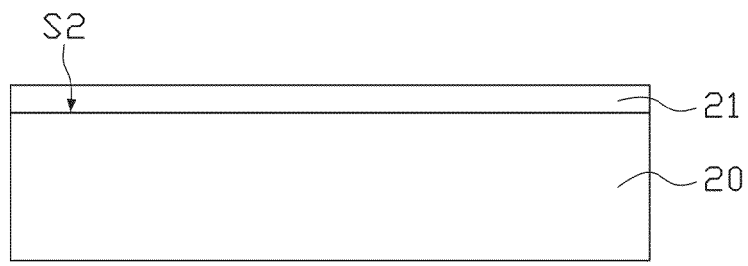
Figure 4C:
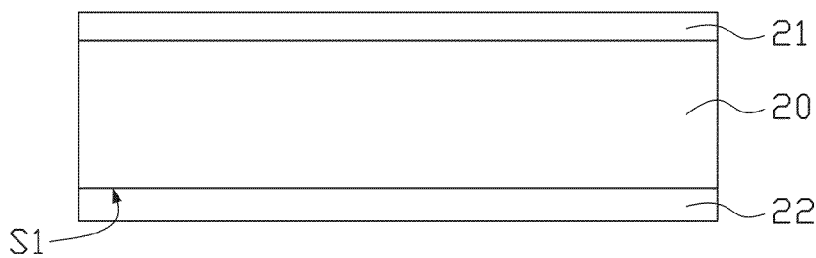
Figure 4D:
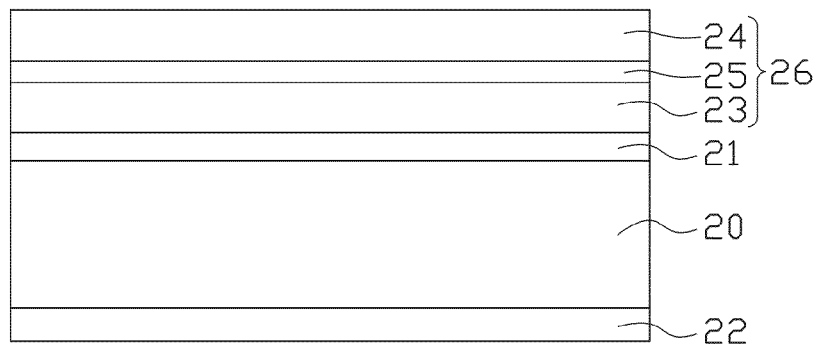
Figure 4E:
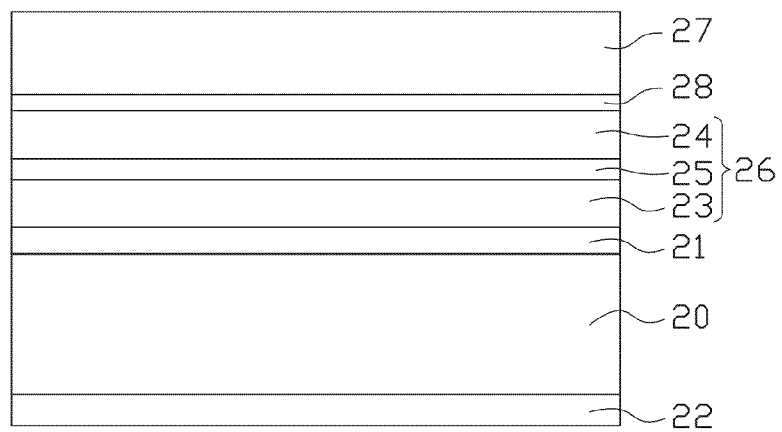
Figure 4F:
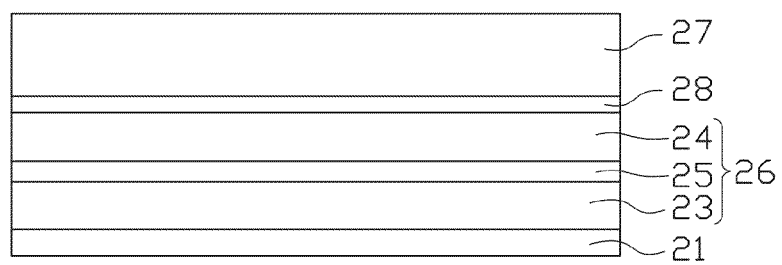
Figure 5A:
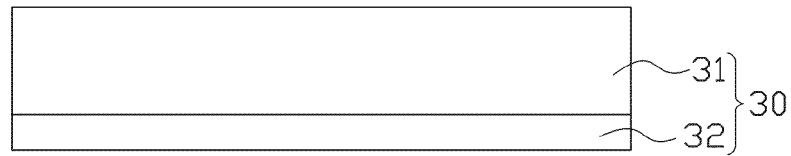
FIGS. 5A-5D illustrate cross-sectional diagrams of a process flow of a fabrication method of a light-emitting device according to another embodiment of the present application.
Figure 5B:
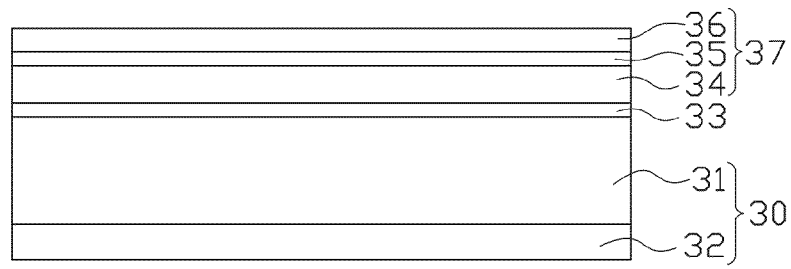
Figure 5C:
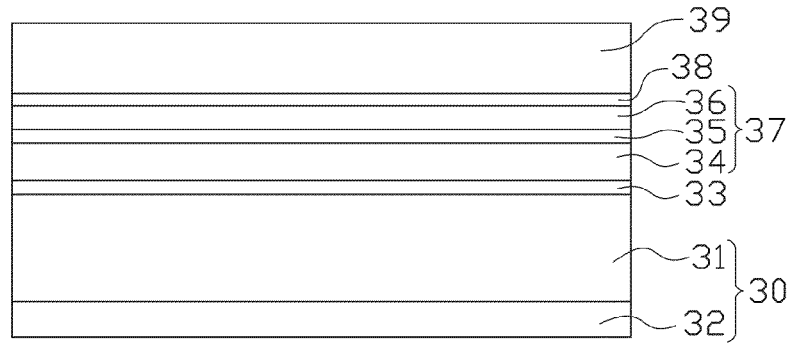
Figure 5D:
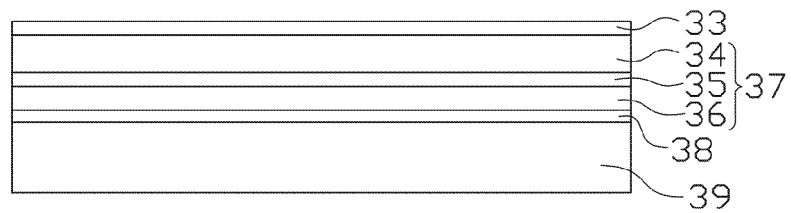

As shown in FIG. 3B, the first semiconductor layer 23 comprising GaN-based material or AlGaInP-based material is formed on the growth substrate 20 such as the silicon substrate. The CTE of silicon is $3.59 \times 10^{-6}$ $K^{-1}$ and the CTE of gallium nitride (GaN) is $5.59 \times 10^{-6}$ $K^{-1}$. The difference of the coefficient of thermal expansion (CTE) between silicon and gallium nitride (GaN) is over 50%. The difference of CTE between gallium nitride (GaN) and silicon provides a tensile stress 20a as illustrated in FIG. 3B. When the protective layer 22, for example, comprising $SiO_2$ is formed on the first surface S1 of the growth substrate 20 such as the silicon substrate, the CTE of silicon is $3.59 \times 10^{-6}$ $K^{-1}$, the CTE of $SiO_2$ is $7.2 \times 10^{-6}$ $K^{-1}$, and the difference between the CTE of silicon and $SiO_2$ provides a compressive stress 20b as illustrated in FIG. 3B. The directions of the tensile stress and the compressive stress are opposite to each other, so approximately flat surfaces S1 and S2 of the growth substrate 20 can be provided. FIG. 3C illustrates a plane view of a surface of the light-emitting device according to an embodiment of the present application. As shown in FIG. 3C, the chipping and cracking of the light-emitting device are reduced compared with that of the light-emitting device illustrated in FIG. 2.

FIGS. 4A-4F illustrate cross-sectional diagrams of a process flow of the fabrication method of the light-emitting device according to an embodiment of the present application. As shown in FIGS. 4A-4F, the fabrication method of the light-emitting device comprises:
(a) providing the growth substrate 20;
(b) forming the buffer layer 21 on the second surface S2 of the growth substrate 20;
(c) forming the protective layer 22 on the first surface 51 of the growth substrate 20;
(d) forming the first semiconductor layer 23 on the second surface S2 of the growth substrate 20 opposite to the first surface 51, wherein the CTE of the growth substrate 20 is smaller than the CTE of the protective layer 22 and the first semiconductor layer 23;
(e) forming a second semiconductor layer 24 on the first semiconductor layer 23, and a light-emitting layer 25 between the first semiconductor layer 23 and the second semiconductor layer 24 to form a semiconductor stack 26, wherein the electrical conductivity type of the first semiconductor layer 23 is different from that of the second semiconductor layer 24;
(f) forming a bonding layer 28 on the semiconductor stack 26;
(g) forming a support substrate 27 on the bonding layer 28; and
(h) removing the growth substrate 20 from the semiconductor stack 26, wherein the buffer layer 21 is optionally remained on the semiconductor stack 26.

In an embodiment of the present application, the material of the support substrate 27 can be a conductive substrate comprising semiconductor material or metal material. The thickness of the support substrate 27 is between 400 µm and 1500 µm. The fabrication method of the light-emitting device further comprises forming a first electrode (not shown) and a second electrode (not shown) on different sides of the semiconductor stack 26 respectively.

In another embodiment of the present application, the material of the support substrate 27 can be a non-conductive substrate comprising AlN or non-doped silicon. The fabrication method of the light-emitting device further comprises forming a first electrode (not shown) and a second electrode (not shown) both on the same side of the semiconductor stack 26.

In an embodiment of the present application, the support substrate 27 can be connected to the semiconductor stack 26 by metal bonding with the bonding layer 28, and the material of the bonding layer 28 comprises metal like Au, Sn, Cr, Zn, Ni, Ti, Pt, or the combination thereof. In another embodiment of the present application, the support substrate 27 can be connected to the semiconductor stack 26 by glue bonding with the bonding layer 28, and the material of the bonding layer 28 comprises transparent materials like epoxy, polyimide (PI), perfluorocyclobutane (PFCB), benzocyclobutene (BCB), spin-on glass (SOG), and silicone.

FIGS. 5A-5D illustrate cross-sectional diagrams of a process flow of the fabrication method of the light-emitting device according to another embodiment of the present application. As shown in FIGS. 5A-5D, the fabrication method of the light-emitting device comprises:
(a) providing a growth substrate 30 comprising a first region 32 and a second region 31 opposite to the first region 32, wherein the first region 32 comprises a first material such as $Al_2O_3$, $SiO_2$, and the second region 31 comprises a second material such as silicon, wherein the CTE of the first material is larger than that of the second material;
(b) forming a buffer layer 33 on the growth substrate 30 adjacent to the second region 31;
(c) forming a first semiconductor layer 34 on the buffer layer 33, wherein the CTE of the first semiconductor layer 34 is larger than that of the second material of the growth substrate 30;
(d) forming a second semiconductor layer 36 on the first semiconductor layer 34, and a light-emitting layer 35 between the first semiconductor layer 34 and the second semiconductor layer 36 to form a semiconductor stack 37;
(e) forming a bonding layer 38 on the semiconductor stack 37;
(f) forming a support substrate 39 on the bonding layer 38; and
(g) removing the growth substrate 30 from the semiconductor stack 37, wherein the buffer layer 33 is optionally remained on the semiconductor stack 37.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A fabrication method of a light-emitting device, comprising:
   providing a growth substrate;
   forming a protective layer on a first surface of the growth substrate; and
   forming a first semiconductor layer on a second surface of the growth substrate opposite to the first surface, wherein the coefficient of thermal expansion of the growth substrate is smaller than that of the protective layer and the first semiconductor layer, wherein the thickness of the growth substrate is larger than the thickness of the protective layer and the thickness of the first semiconductor layer; forming a second semiconductor layer on the first semiconductor layer, and a light-emitting layer between the first semiconductor layer and the second semiconductor layer to form a semiconductor stack, wherein an electrical conductivity type of the first semiconductor layer is different from that of the second semiconductor layer; and removing the growth substrate from the semiconductor stack.

2. The fabrication method according to claim 1, further comprising forming a buffer layer between the growth substrate and the first semiconductor layer.

3. The fabrication method according to claim 1, further comprising forming a bonding layer on the semiconductor stack.

4. The fabrication method according to claim 3, further comprising forming a support substrate on the bonding layer.

5. The fabrication method according to claim 4, wherein the material of the support substrate is a conductive substrate.

6. The fabrication method according to claim 5, wherein the conductive substrate comprises semiconductor material or metal material.

7. The fabrication method according to claim 5, further comprising forming a first electrode and a second electrode on different sides of the semiconductor stack respectively.

8. The fabrication method according to claim 4, wherein the material of the support substrate is a non-conductive substrate.

9. The fabrication method according to claim 8, wherein the non-conductive substrate comprises AN or non-doped silicon.

10. The fabrication method according to claim 8, further comprising forming a first electrode and a second electrode both on the same side of the semiconductor stack.

11. The fabrication method according to claim 1, wherein the growth substrate comprises silicon material.

12. The fabrication method according to claim 2, wherein the material of the buffer layer comprises semiconductor material.

13. The fabrication method according to claim 1, wherein the material of the protective layer comprises dielectric material, semiconductor material or metal material.

14. The fabrication method according to claim 1, wherein the coefficient of thermal expansion of the protective layer is larger than that of the first semiconductor layer.

15. The fabrication method according to claim 1, wherein the thickness of the protective layer is smaller than or approximately the same as that of the semiconductor stack.

16. The fabrication method according to claim 1, wherein the semiconductor stack is epitaxially grown on the growth substrate.

* * * * *